United States Patent
Taatjes et al.

(10) Patent No.: US 6,167,893 B1
(45) Date of Patent: Jan. 2, 2001

(54) DYNAMIC CHUCK FOR SEMICONDUCTOR WAFER OR OTHER SUBSTRATE

(75) Inventors: Steven W. Taatjes, West Linn; John F. Ostrowski, Hillsboro, both of OR (US)

(73) Assignee: Novellus Systems, Inc., San Jose, CA (US)

( * ) Notice: Under 35 U.S.C. 154(b), the term of this patent shall be extended for 0 days.

(21) Appl. No.: 09/248,169

(22) Filed: Feb. 9, 1999

(51) Int. Cl.[7] ....................................................... B08B 3/02
(52) U.S. Cl. ........................ 134/147; 134/153; 134/902; 34/58; 414/941
(58) Field of Search ..................... 134/153, 95.1, 134/902, 147; 34/58, 312, 313, 317; 414/744.8, 936, 941

(56) References Cited

U.S. PATENT DOCUMENTS

| | | | |
|---|---|---|---|
| 4,724,619 | * 2/1988 | Poli et al. | 34/58 |
| 4,788,994 | * 12/1988 | Shinbara | 134/157 |
| 5,421,056 | * 6/1995 | Tateyama et al. | 15/302 |
| 5,445,172 | * 8/1995 | Thompson et al. | 134/153 |
| 5,566,466 | * 10/1996 | Hearne | 34/58 |
| 5,666,985 | * 9/1997 | Smith, Jr. et al. | 134/142 |
| 5,715,610 | * 2/1998 | Smith, Jr. et al. | 34/58 |
| 5,775,000 | * 7/1998 | Maekawa et al. | 34/58 |
| 5,954,072 | * 9/1999 | Matusita | 134/149 |

* cited by examiner

Primary Examiner—Frankie L. Stinson
(74) Attorney, Agent, or Firm—Skjerven Morrill MacPherson LLP; David E. Steuber

(57) ABSTRACT

A dynamic chuck for holding a semiconductor wafer or other substrate includes a plurality of clamping arms mounted radially about a central axis of rotation of the wafer or other substrate. Each of the arms is mounted such that it is free to pivot about a horizontal axis. As the chuck rotates the substrate, a centrifugal force acts on each of the arms, causing it to pivot about its axis of rotation and thereby forcing a holding surface of the arm against a peripheral edge of the substrate. The dynamic chuck is applicable to any type of device in which a semiconductor wafer or other substrate must be held in a centered positioned while it is being spun, including wafer cleaning and rinsing apparatus.

7 Claims, 4 Drawing Sheets

DYNAMIC CHUCK FOR SEMICONDUCTOR WAFER OR OTHER SUBSTRATE

BACKGROUND OF THE INVENTION

Semiconductor wafers and other substrates are frequently subjected to high-speed spinning when they are rinsed or dried. During the spinning operation the wafer must be properly centered, with its center of gravity at or very near the axis of rotation. The wafer must also be held securely, to prevent any disparity between its center of gravity and the axis of rotation from causing the wafer to be thrown outward by centrifugal force. This is particularly the case as the speed of rotation increases.

Most wafer holding systems are either passive or active. That is, either the wafer rests in or on the supporting surface (frequently referred to as a "chuck") or some type of mechanism or force system is used to hold the wafer in place. Example of such mechanisms and systems are mechanical grippers and vacuum clamps. Passive systems generally require that the wafer be placed on the chuck with great precision. While this can normally be done where the wafers are manually loaded, it is difficult to consistently load the wafers in the proper position with automatic, robot-operated systems.

SUMMARY

A dynamic chuck according to this invention includes a wafer supporting member and a plurality of pivotable clamping arms. Each of the clamping arms is pivotable about a horizontal axis of rotation located below a wafer supported on the supporting member. Each of the clamping arms has a center of gravity located below the axis and a holding surface located above said axis for contacting a peripheral edge of said wafer.

In one embodiment according to this invention, three pivotable clamping arms are mounted, respectively, on three beams which extend radially from a vertical axis about which the wafer rotates. The wafer is supported on three support pins positioned, respectively, near the ends of the beams such that the support pins make contact with a peripheral region of the bottom surface of the wafer. Tapered guide pins also positioned near the ends of the beams provide surfaces for guiding the wafer to an approximate position on the support pins. The beams are connected to a spin motor which rotates the chuck and the wafer about the vertical axis during rinsing and/or drying operations.

Since the center of gravity of each clamping arm is located below its horizontal axis of rotation, as the chuck is rotated the upper portions of the clamping arms are urged inward and grip the edge of the wafer. The pressure exerted by each clamping arm against the wafer is a function of, among other things, the distance between the center of gravity and axis of rotation of the clamping arm and the speed of rotation of the radial beams.

This invention also includes a method which comprises positioning a semiconductor wafer between a plurality of clamping arms, each of the clamping arms being positioned equidistant from a vertical axis of rotation of the wafer and being rotatable about a horizontal axis, and each of the clamping arms having a center of gravity which is spaced apart from the horizontal axis of rotation; and causing the clamping arms to revolve about the vertical axis of rotation such that a centrifugal force acting on each of the clamping arms causes each of the clamping arms to rotate about the horizontal axis and thereby causes a holding surface on each of the clamping arms to exert a force against an edge of the wafer.

The relative positions of the center of gravity and horizontal axis of rotation of each clamping arm also assures that the clamping arms will pivot to an open position when the chuck is not rotating about its vertical axis.

A dynamic wafer chuck according to this invention allows a wide positioning tolerance when a wafer is placed on the chuck and eliminates the need for precise wafer position sensing before cleaning, rinsing and spin-drying the wafer.

BRIEF DESCRIPTION OF THE DRAWINGS

The invention will be better understood by reference to the following description and drawings, in which.

DETAILED DESCRIPTION OF THE INVENTION

Figure 1:
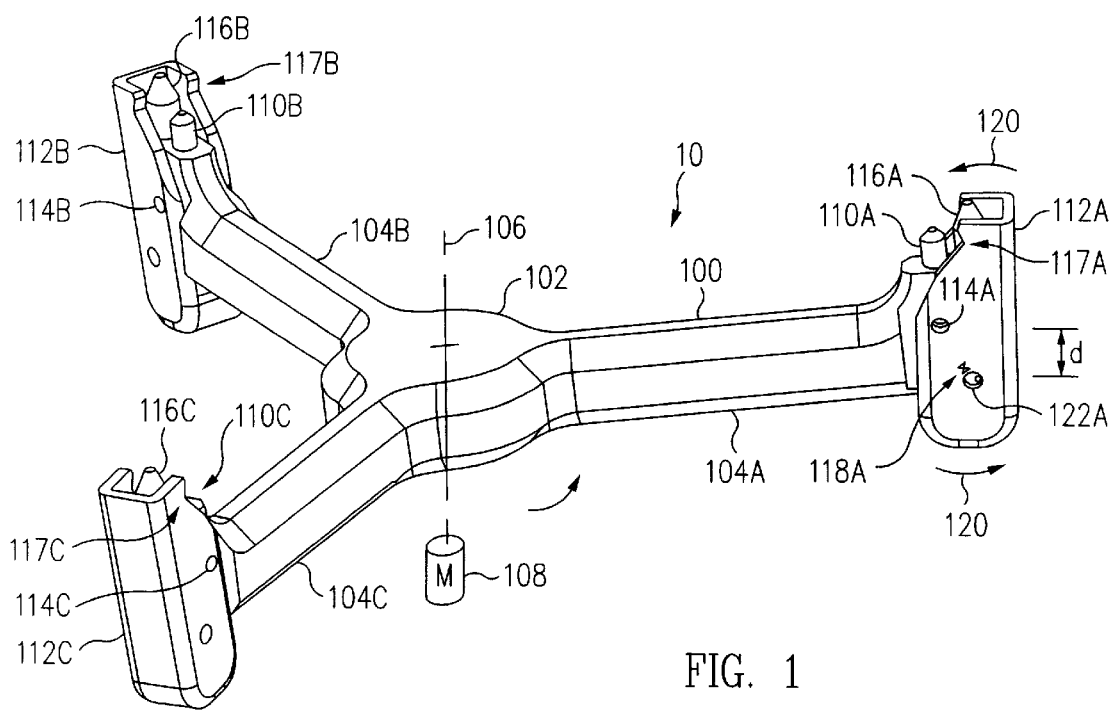
FIG. 1 shows a perspective view of a dynamic chuck according to this invention.

FIG. 1 shows a perspective view of a dynamic chuck 10 according to this invention. Chuck 10 includes a Spyder body 100 which includes a hub 102 and beams 104A, 104B and 104C which extend outward radially from hub 102. When a wafer (not shown) is being spun during rinsing and/or drying operations, chuck 10 rotates about a vertical axis 106, driven by a variable-speed spin motor shown symbolically at 108. A drive shaft (not shown) connects motor 108 to chuck 10 The wafer is supported by support pins 110A, 110B and 110C, which are fixed near the ends of beams 104A, 104B and 104C, respectively. The chuck is preferably made of a strong, corrosion resistant material such as PVDF plastic, a ceramic, or titanium.

Also fixed near the ends of beams 104A–104C are clamping arms 112A, 112B and 112C, which pivot on pivot pins 114A, 114B and 114C. Pivot pins 114A–114C are press fitted in holes bored in beams 104A–104C and fit loosely in holes in clamping arms 112A–112C to allow arms 112A–112C to pivot freely. Clamping arms 112A–112C also contain guide pins 116A, 116B and 116C, and wafer-holding notches 117A, 117B and 117C are formed in clamping arms 112A–112C.

A wafer is lowered onto the support pins 110A–110C by a robot or other means. The tapered surfaces of the guide pins 116A–116C are angled (e.g., at 15°) such that, if the wafer is placed "off-center" when the robot releases it, the wafer slides down the guide pins 116A–116C and is thereby guided into position on the support pins 110A–110C, typically to within about 1 mm of its proper "centered" position", where the center of gravity of the wafer coincides with vertical axis 106. If the wafer has been plated, the tips of support pins 110A–110C preferably contact the wafer in a peripheral region outside the plated area. Thus the support pins 110A–110C do not block the rinse water from the plated area.

Figure 2A:
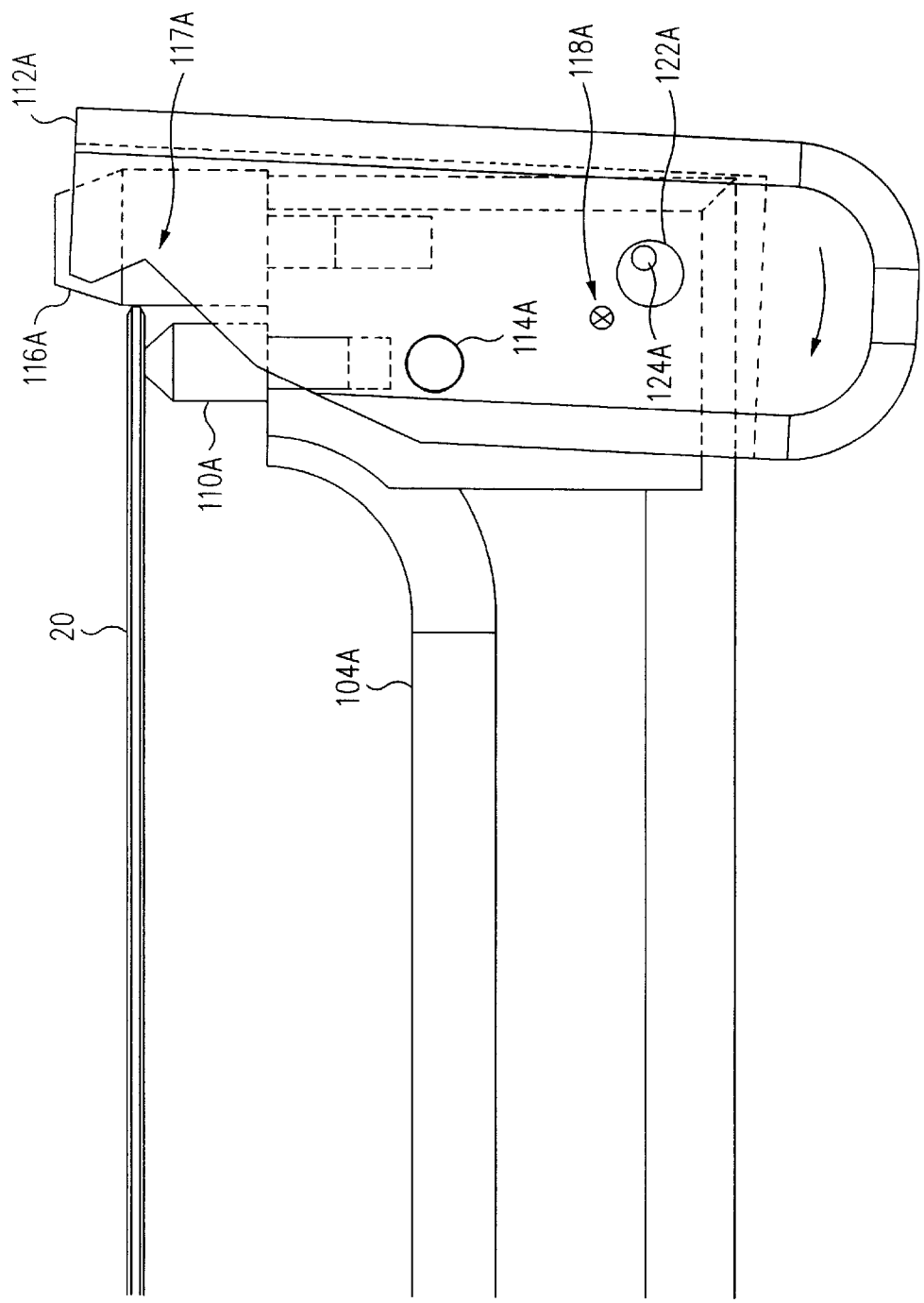
FIGS. 2A and 2B show a detailed views of one of the supporting pins and a corresponding guide pin and clamping arm when the dynamic chuck is at rest and spinning, respectively.
Figure 2B:
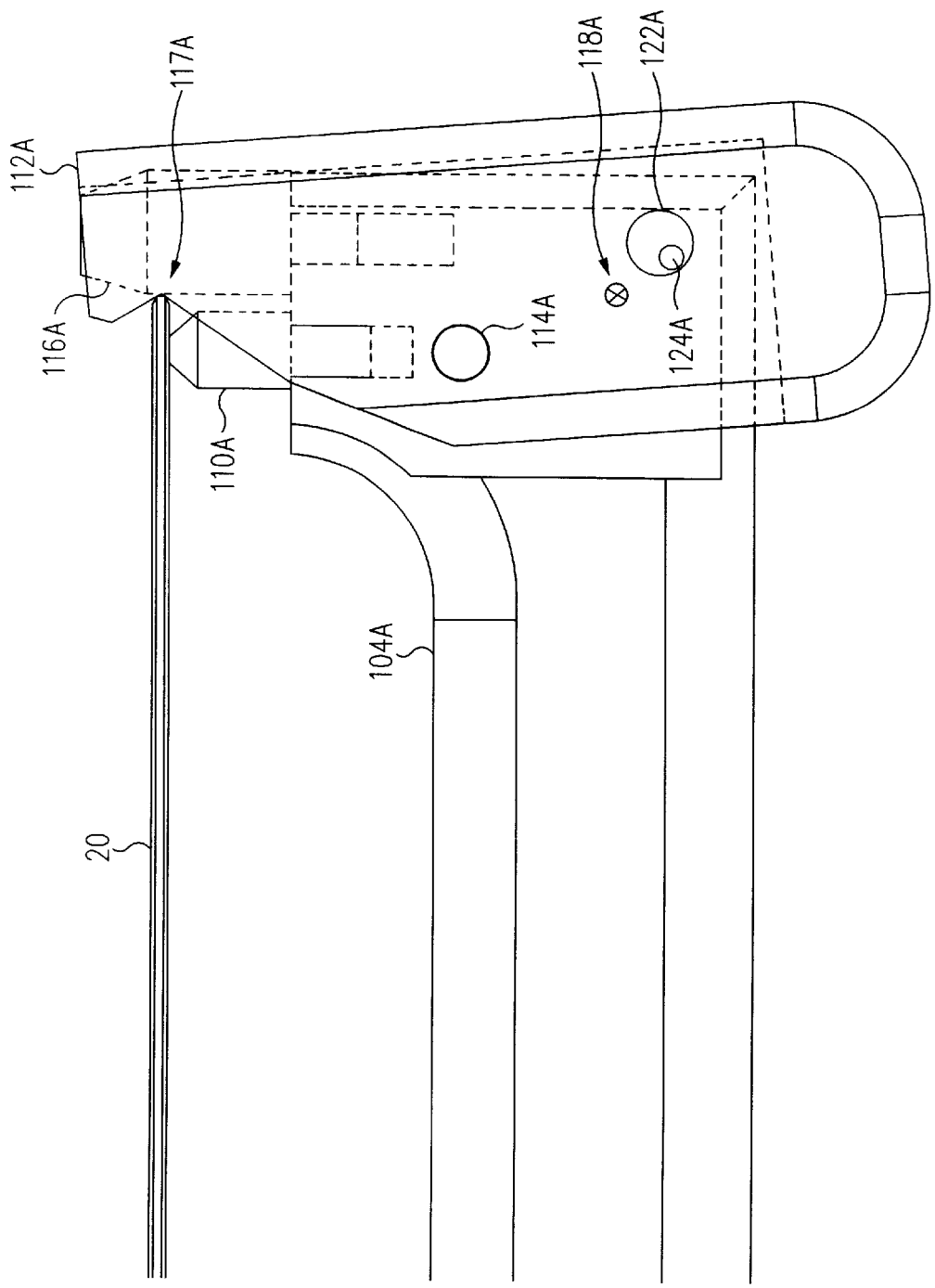

The center of gravity of clamping arm 112A is located at 118A, below the pivot pin 114A by a distance "d" shown in FIG. 1. Thus, as chuck 10 rotates clamping arm 112A tends to rotate in the direction arrows 120, forcing wafer-holding notch 117A laterally against the edge of the wafer. FIGS. 2A and 2B show detailed side views of clamping arm 112A and a wafer 20 when the body 100 is at rest (FIG. 2A), and when body 100 is spinning with clamping arm 112A having rotated clockwise such that wafer 20 is held in notch 117A (FIG. 2B).

Similarly, notches 117B and 117C on clamping arms 112B and 112C are forced against the peripheral edge of the wafer, thereby holding the wafer securely in place with the center of gravity of the wafer aligned with the rotational axis 106.

As shown in FIGS. 2A and 2B, clamping arm 112A also includes a hole 122A which is larger than a stroke limiting pin 124A which projects from beam 104A into hole 122A. Since the center of gravity 118A is further removed from the rotational axis 106 than the pivot pin 114A, when chuck 10 is stationary the moment of force on center of gravity 118A tends to rotate clamping arm 112A in a direction opposite to arrows 120. This action urges the upper end of clamping arm 112A to an "open" position, allowing a wafer to be placed onto support pin 110A. This rotation is limited when pin 124A contacts a side of hole 122A. The "open" positions of the upper ends of clamping arms 112A–112C are preferably set to create an opening 2–3 mm larger than the largest size of the wafer.

Figure 1A:
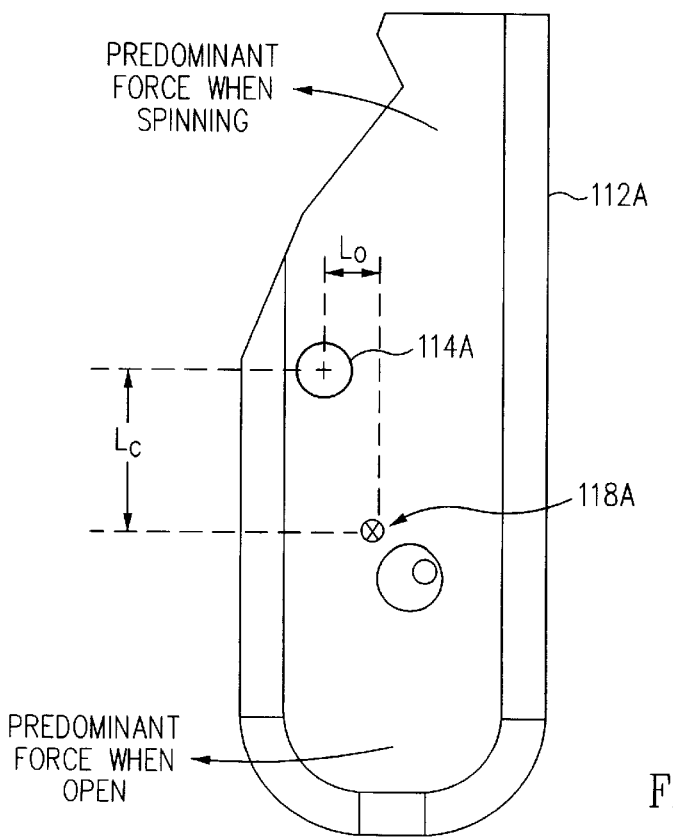

FIG. 1A shows a lever arm $L_c$, the vertical distance between the center of pivot pin 114A and center of gravity 118A, which produces the wafer clamping force when chuck 10 is spinning, and a lever arm $L_o$, the horizontal distance between the center of pivot pin 114A and center of gravity 118A, which produces the clamp releasing force when chuck 10 is at rest.

As chuck 10 rotates at a greater speed about axis 106, the centrifugal force acting on clamping arm 112A gradually increases until it overcomes the gravitation force acting at center of gravity 118A. In one embodiment, this occurs at about 80 RPM. When this point is reached, clamping arm 112A begins to rotate about pivot pin 114A in the direction of arrows 120, and the upper end of clamping arm 112A at notch 117A exerts a force on the edge of the wafer. Clamping arms 112B and 112C behave in a similar way to force notches 117B and 117C against the edge of the wafer. The stroke limiting pin 124A allows the upper end of clamping arm 112A to advance towards the axis 106 until it contacts a side of hole 122A at a "closed" position. The upper ends of clamping arms 112B and 112C likewise advance towards axis 106 until notches 117A–117C together define a diameter equal to the minimum size of a wafer. Since clamping arms 112A–112C are identical and are spaced equidistant from axis 106, their rotation about pivot pins 114A–114C, respectively, is matched and thus the wafer is brought to and held at a centered position (with its center at axis 106).

Figure 3:
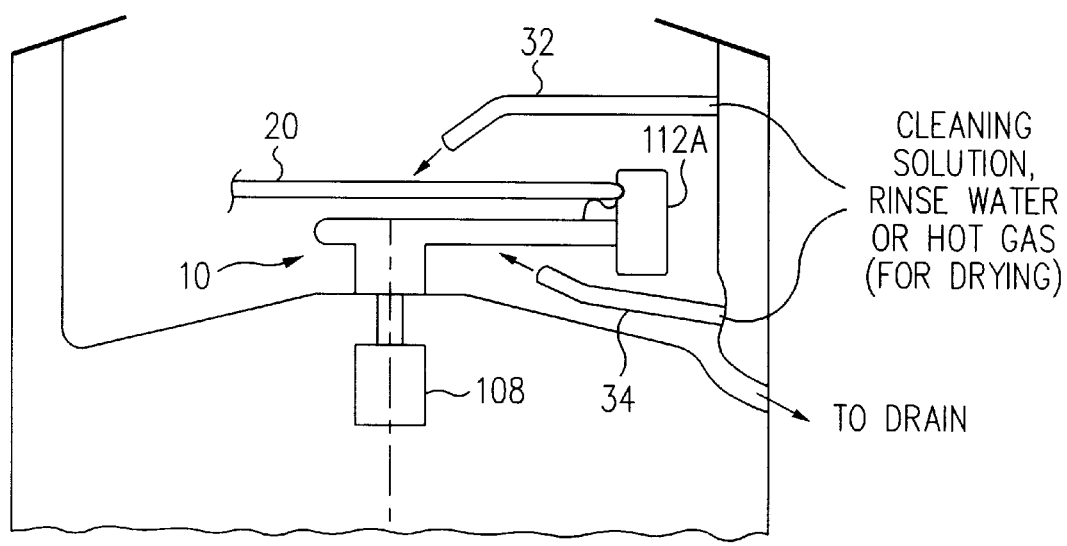
FIG. 3 shows a cross-sectional view of the dynamic chuck in a spin bowl with rinsing and/or drying nozzles positioned above and below the wafer.

Nozzles are typically used to apply a cleaning solution or rinse liquid to a wafer that is held in the chuck. FIG. 3 shows wafer 20 held by chuck 10 positioned in a spin bowl 30. An upper nozzle 32 directs a stream of a rinse or clean liquid or a drying gas such as $N_2$ against the center of the top surface of wafer 20. A lower nozzle 34 directs a stream of rinse or clean liquid against the bottom surface of wafer 20. The clamping action of arms 112A, 112B and 112C allows the liquid to be applied against the bottom surface of the wafer 20 without lifting the wafer from the chuck 10. A plurality of upper and lower rinse, clean and/or drying nozzles can be located at various radial positions around the wafer.

Dynamic chucks in accordance with this invention can be used in a wide variety of devices wherein a wafer or other substrate must be held securely in a centered position while it is subjected to a spinning motion. These include, without limitation, devices which apply a liquid to clean or rinse a wafer or those which apply a gas (such as air or dry nitrogen) to dry the wafer.

The foregoing description is intended to be illustrative and not limiting. Numerous alternative embodiments will be apparent to person skilled in the art.

We claim:

1. A dynamic chuck comprising:

a substrate supporting member comprising a first surface for supporting a substrate;

a plurality of pivotable clamping arms mounted on said substrate supporting member, each of said clamping arms being freely pivotable about an axis located below said surface, each of said clamping arms having a center of gravity located below said axis and a second surface located above said axis for contacting a peripheral edge of said substrate.

2. The dynamic chuck of claim 1 wherein said substrate supporting member comprises a plurality of beams, one of said clamping arms being pivotably mounted at an end of each of said beams.

3. The dynamic chuck of claim 1 wherein said first surface comprises a support pin.

4. The dynamic chuck of claim 3 wherein said chuck comprises a third surface for guiding a substrate into a position on said support pin.

5. The dynamic chuck of claim 1 in combination with a nozzle for applying a fluid to a substrate held on said chuck.

6. The dynamic chuck of claim 5 in combination with a nozzle for applying a cleaning liquid to a substrate held on said chuck.

7. The dynamic chuck of claim 5 in combination with a nozzle for applying a rinse liquid to a substrate held on said chuck.

* * * * *